United States Patent
Wu et al.

(10) Patent No.: US 11,949,376 B2
(45) Date of Patent: Apr. 2, 2024

(54) TEMPERATURE COMPENSATED VOLTAGE-CONTROLLED OSCILLATOR

(71) Applicant: Realtek Semiconductor Corp., Hsinchu (TW)

(72) Inventors: I-Chang Wu, Fremont, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/521,939

(22) Filed: Nov. 9, 2021

(65) Prior Publication Data
US 2023/0147693 A1   May 11, 2023

(51) Int. Cl.
*H03B 5/12* (2006.01)
*H03B 5/04* (2006.01)

(52) U.S. Cl.
CPC ............. *H03B 5/1228* (2013.01); *H03B 5/04* (2013.01); *H03B 5/1212* (2013.01); *H03B 5/1253* (2013.01)

(58) Field of Classification Search
CPC .................................................. H03B 5/1228
USPC ....................................................... 331/117 R
See application file for complete search history.

(56) References Cited

U.S. PATENT DOCUMENTS

| | | | | |
|---|---|---|---|---|
| 7,391,272 B2* | 6/2008 | Fujita | ..................... | H03B 5/124 331/177 V |
| 8,164,159 B1* | 4/2012 | Armstrong | ........... | H03B 5/1234 257/659 |
| 2009/0033428 A1* | 2/2009 | Karri | ..................... | H03B 5/1228 331/17 |
| 2009/0134947 A1* | 5/2009 | Tarng | ...................... | H03B 5/04 331/116 FE |
| 2012/0001699 A1* | 1/2012 | Yang | .................... | H03B 5/1212 331/117 FE |
| 2018/0183442 A1* | 6/2018 | Pavao Moreira | ....... | H03L 1/023 |

* cited by examiner

*Primary Examiner* — Joseph Chang
(74) *Attorney, Agent, or Firm* — McClure, Qualey & Rodack, LLP

(57) ABSTRACT

A VCO (voltage-controlled oscillator) includes: a resonant tank having a parallel connection of an inductor, a fixed capacitor, a variable capacitor, a first temperature compensating capacitor, and a second temperature compensating capacitor across a first node and a second node, and configured to establish an oscillation of a first oscillatory voltage at the first node and a second oscillatory voltage at the second node; and a regenerative network placed across the first node and the second node to provide energy to sustain the oscillation. The variable capacitor is controlled by a control voltage, the first temperature compensating capacitor is controlled by a first temperature tracking voltage of a positive temperature coefficient, and the second temperature compensating capacitor is controlled by a second temperature tracking voltage of a negative temperature coefficient.

10 Claims, 3 Drawing Sheets

TEMPERATURE COMPENSATED VOLTAGE-CONTROLLED OSCILLATOR

BACKGROUND OF THE DISCLOSURE

Field of the Disclosure

This present disclosure generally relates to voltage-controlled oscillators and more particularly to voltage-controlled oscillators with temperature compensation.

Description of Related Art

A VCO (voltage-controlled oscillator) outputs an oscillatory signal having an oscillation frequency controlled by a control voltage. In this present disclosure, hereafter, "frequency of oscillation" and "oscillation frequency" are the same and interchangeable in a context of VCO.

As depicted in a schematic shown in FIG. 1, a prior art VCO 100 comprises: a resonant tank 110 configured to determine a frequency of an oscillation in accordance with a control voltage $V_C$; and a regenerative network 120 comprising two NMOS (n-channel metal oxide semiconductor) transistors 121 and 122 configured in a cross-coupling topology to establish a negative resistance to provide energy to sustain the oscillation. Resonant tank 110 comprises an inductor 111 (of inductance $L_{111}$), a fixed capacitor 112 (of capacitance $C_{112}$), and a variable capacitor 115 (of capacitance $C_{115}$) comprising two varactors 113 and 114 controlled by $V_C$. A center-tap of the inductor 111 is connected to a power supply node denoted by "$V_{SP}$." VCO 100 is well known in the prior art and thus not described in detail here.

An oscillation frequency $f_0$ of the VCO 100 is approximately:

$$f_0 = \frac{1}{2\pi\sqrt{L_{111}(C_{112} + C_{115} + C_{120})}} \quad (1)$$

Here, $C_{120}$ is a parasitic capacitance of the regenerative network 120.

As used in this present disclosure, a "varactor" is a two-terminal circuit element that comprises a positive terminal marked by "+" and a negative terminal marked by "−"; a capacitance of the varactor increases (decreases) when a voltage at the positive terminal rises (falls) and decreases (increases) when a voltage at the negative terminal rises (falls); when the positive terminal is connected to a control voltage configured to control the capacitance, the varactor is said to be forward connected; when the negative terminal is connected to a control voltage configured to control the capacitance, the varactor is said to be backward connected. Having said that, the two varactors 113 and 114 in FIG. 1 are clearly backward connected; when $V_C$ rises (falls), the capacitance of the two varactors 113 and 114 decrease (increases) and consequently $C_{115}$ decreases (increases), and as a result the oscillation frequency of VCO 100 increases (decreases).

In practice, VCO 100 is usually incorporated in a phase lock loop that adjusts the control voltage $V_C$ in a closed-loop manner so that $f_0$ is equal to target value that is equal to a frequency of a reference clock times a multiplication factor; if $f_0$ is higher (lower) than the target value, the phase lock loop will lower (raise) the control voltage $V_C$ to lower (raise) $f_0$. However, a realistic phase lock loop circuit has a limited range for the control voltage $V_C$ that it can generate. The phase lock loop fails if the control voltage $V_C$ has already reached the minimum (maximum) value that the phase lock loop can generate but $f_0$ is still higher (lower) than the target value. Therefore, care must be taken to ensure that $f_0$ can be equal to the target value with a value of the control voltage $V_C$ that is within the range that the phase lock loop can generate.

In practice, $L_{111}$ is temperature dependent, so are $C_{112}$, $C_{115}$, and $C_{120}$; given the same control voltage $V_C$, $f_0$ often varies with the temperature. Consequently, when the temperature changes, $f_0$ will change, and the phase lock loop must adjust the control voltage $V_C$ to compensate the change of $f_0$ due to the temperature change. If the control voltage $V_C$ has reached its limit but the change of $f_0$ due to the temperature change is not yet fully compensated, the phase lock loop fails.

What is desired is a VCO that can effectively compensate for a change of oscillation frequency due to a temperature change.

SUMMARY OF THE DISCLOSURE

In an embodiment, a VCO (voltage-controlled oscillator) comprises: a resonant tank comprising a parallel connection of an inductor, a fixed capacitor, a variable capacitor, a first temperature compensating capacitor, and a second temperature compensating capacitor across a first node and a second node, and configured to establish an oscillation of a first oscillatory voltage at the first node and a second oscillatory voltage at the second node; and a regenerative network placed across the first node and the second node to provide energy to sustain the oscillation, wherein the variable capacitor is controlled by a control voltage, the first temperature compensating capacitor is controlled by a first temperature tracking voltage of a positive temperature coefficient, and the second temperature compensating capacitor is controlled by a second temperature tracking voltage of a negative temperature coefficient.

DETAILED DESCRIPTION OF THIS DISCLOSURE

Figure 1:
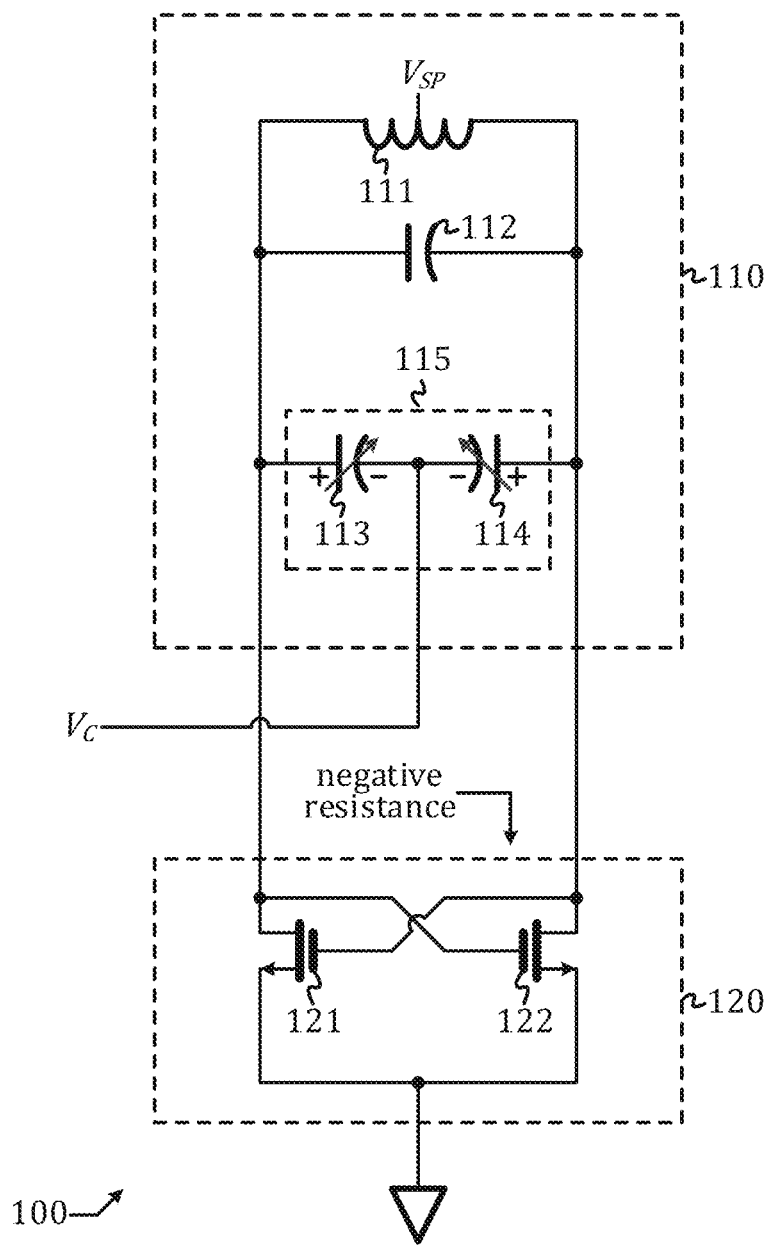
FIG. 1 shows a schematic diagram of a prior art voltage-controlled oscillator.

The present disclosure is directed to voltage-controlled oscillators. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "signal," "frequency," "oscillation," "voltage-controlled oscillator," "parallel connection," "series," "shunt," "circuit node," "ground,"

"power supply node," "MOS (metal oxide semiconductor) transistor," "CMOS (complementary metal oxide semiconductor) process technology," "NMOS (n-channel metal oxide semiconductor) transistor," "PMOS (p-channel metal oxide semiconductor) transistor," "inductor," "inductance," "capacitor," "varactor," "capacitance," "resistor," "resistance," and "low-pass filter." Terms and basic concepts like these, when used in a context of microelectronics, are apparent to those of ordinary skill in the art and thus will not be explained in detail herein.

Those of ordinary skills in the art can read and understand schematics of circuits comprising components such as capacitors, NMOS transistors, PMOS transistors, and so on, and do not need a verbose description about how one component connects with another in the schematics. Those of ordinary skill in the art can also recognize a ground symbol, a capacitor symbol, an inductor symbol, a varactor (variable capacitor) symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A circuit is a collection of at least a transistor, a capacitor, a resistor, and/or other electronic devices inter-connected in a certain manner to embody a certain function.

In this disclosure, a "circuit node" is frequently simply stated as a "node" for short, when what it means is clear from a context.

A signal is a voltage of a variable level that carries a certain information and can vary with time. A level of the signal at a moment represents a state of the signal at that moment.

As mentioned earlier in this present disclosure, a varactor is a two-terminal circuit element of a variable capacitance that comprises a positive terminal marked by "+" and a negative terminal marked by "−"; a capacitance of the varactor increases (decreases) when a voltage at the positive terminal rises (falls) and decreases (increases) when a voltage at the negative terminal rises (falls); when the positive terminal is connected to a control voltage configured to control the variable capacitance, the varactor is said to be forward connected; when the negative terminal is connected to a control voltage configured to control the variable capacitance, the varactor is said to be backward connected.

Figure 2:
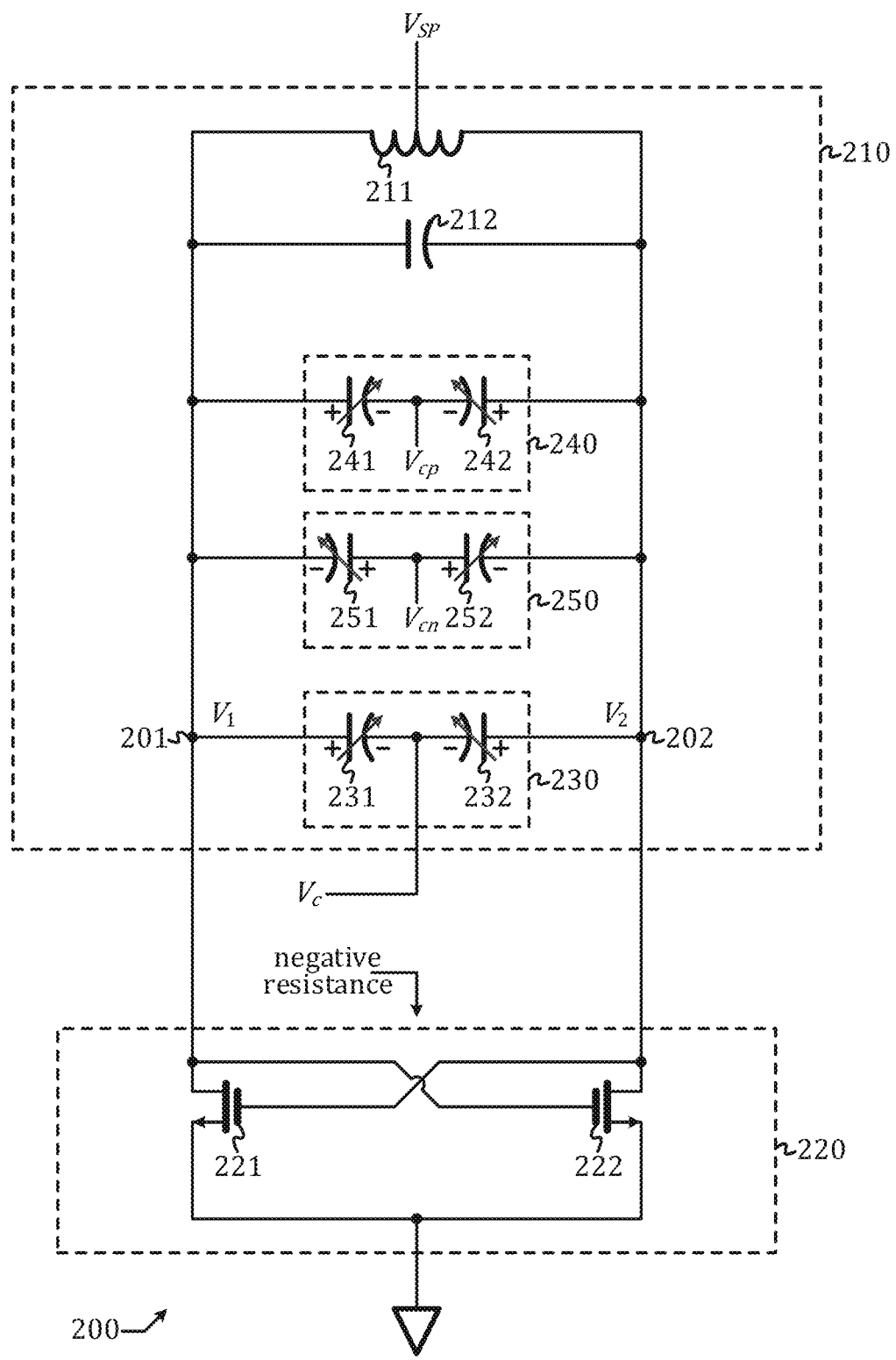
FIG. 2 shows a schematic diagram of a voltage-controlled oscillator in accordance with an embodiment of the present disclosure.

As shown by a schematic depicted in FIG. 2, a VCO 200 in accordance with an embodiment of the present disclosure comprises: a resonant tank 210 comprising an inductor 211 (of inductance $L_{211}$), a fixed capacitor 212 (of capacitance $C_{212}$), a variable capacitor 230 (of capacitance $C_{230}$), a first temperature compensating capacitor 240 (of capacitance $C_{240}$), and a second temperature compensating capacitor 250 (of capacitance $C_{250}$), configured in a parallel connection topology across a first node 201 and a second node 202 to establish an oscillation of a first oscillatory voltage $V_1$ at the first node 201 and a second oscillatory voltage $V_2$ at the second node 202 in accordance with a control by a control voltage $V_c$, a first temperature tracking voltage $V_{cp}$ of a positive temperature coefficient, and a second temperature tracking voltage $V_{cn}$ of a negative temperature coefficient; and a regenerative network 220 comprising two NMOS transistors 221 and 222 configured in a cross-coupling topology to provide a negative resistance across the first node 201 and the second node 202 to sustain the oscillation of $V_1$ and $V_2$. A center-tap of the inductor 211 connects to a power supply node denoted by "$V_{SP}$." NMOS transistors 221 and 222 are said to be cross-coupling because a drain of NMOS transistor 221 connects to a gate of NMOS transistor 222, while a drain of NMOS transistor 222 connects to a gate of NMOS transistor 221; that two MOS transistors configured in a cross-coupling topology can provide a negative resistance to sustain an oscillation is well known to those of ordinary skill in the art and thus not described in detail here.

The variable capacitor 230 comprises two backward connected varactors 231 and 232 controlled by $V_c$. The first temperature compensating capacitor 240 comprises two backward connected varactors 241 and 242 controlled by $V_{cp}$. The second temperature compensating capacitor 250 comprises two forward connected varactors 251 and 252 controlled by $V_{cn}$. $V_{cp}$ is a voltage that will rise when a temperature of VCO 200 rises and thus is said to have a positive temperature coefficient. $V_{cn}$ is a voltage that will fall when the temperature of VCO 200 rises and thus is said to have a negative temperature coefficient.

VCO 200 of FIG. 2 is similar to the VCO 100 of FIG. 1 except that it further includes the first temperature compensating capacitor 240 and the second temperature compensating capacitor 250. An oscillation frequency $f_{osc}$ of the first oscillatory voltage $V_1$ and the second oscillatory voltage $V_2$ is approximately equal to a resonant frequency of the resonant network 210 and can be written as:

$$f_{OSC} = \frac{1}{2\pi\sqrt{L_{211}(C_{212} + C_{230} + C_{240} + C_{250} + C_{220})}} \quad (2)$$

Here, $C_{220}$ is a parasitic capacitance of the regenerative network 220 across the two nodes 201 and 202.

Without the first temperature compensating capacitor 240 and the second temperature compensating capacitor 250, $L_{211}$ increases (decreases) when the temperature of VCO 200 rises (falls) and will result in a decrease (increase) of $f_{osc}$. When the temperature rises (falls), $V_{cp}$ rises (falls) and causes $C_{240}$ to decrease (increase) thanks to the two backward connected varactors 241 and 242, while at the same time $V_{cn}$ falls (rises) and causes $C_{250}$ to decrease (increase) thanks to the two forward connected varactors 251 and 252; as a result, the effect of the increase (decrease) of $L_{211}$ can be compensated by the effect of the decrease (increase) of $C_{240}$ and $C_{250}$. This way, a change of the oscillation frequency of VCO 200 due to a temperature change can be reduced.

Both the first temperature compensating capacitor 240 and the second temperature compensating capacitor 250 can fulfill a purpose of temperature compensation; therefore, using merely one of the two is sufficient, as far as temperature compensation is concerned. However, using both of the two has an advantage that, the circuit becomes more balanced and more immune to noise. For instance, an increase of a voltage level of $V_1$ due to a noise will cause an increase of $C_{240}$ but at the same time will cause a decrease of $C_{250}$ that can offset the increase of $C_{240}$.

Figure 3:
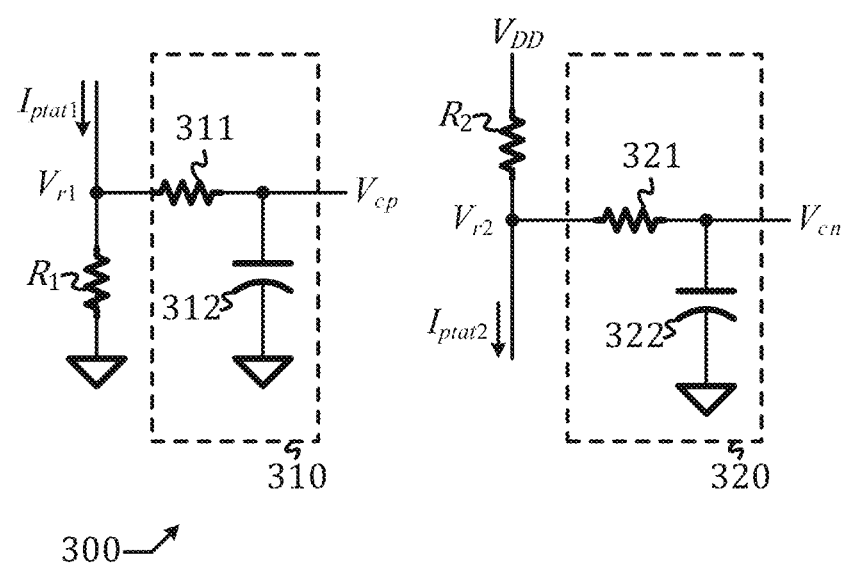
FIG. 3 shows a schematic diagram of a temperature tracking voltage generator.

$V_{cp}$ is a voltage that rises (falls) when the temperature of VCO 200 rises (falls), while $V_{cn}$ is a voltage that falls (rises) when the temperature of VCO 200 rises (falls). A schematic diagram of a temperature tracking voltage generator 300 that can be used to generate $V_{cp}$ and $V_{cn}$ is shown in FIG. 3. The temperature tracking voltage generator 300 comprises: a first resistor $R_1$ configured to receive a first PTAT (proportional to absolute temperature) current $I_{ptat1}$ and establish a first reference voltage $V_{r1}$, and a first low-pass filter 310 comprising a series resistor 311 and a shunt capacitor 312 configured to receive the first reference voltage $V_{r1}$ and output $V_{cp}$; a second resistor $R_2$ configured to receive a second PTAT (proportional to absolute temperature) current $I_{ptat2}$ and establish a second reference voltage $V_{r2}$, and a second low-pass filter 320 comprising a series resistor 321 and a shunt capacitor 322 configured to receive the second reference voltage $V_{r2}$ and output $V_{cn}$. Here, "$V_{DD}$" denotes a power supply node. A PTAT current is a current of a level proportional to an absolute temperature. A PTAT current and how to generate a PTAT current are well known in the prior art and well understood by those of ordinary skills in the art and thus not described in detail here. $I_{ptat1}$ and $I_{ptat2}$ are both PTAT currents, and thus increase (decrease) when the temperature rises (falls).

We can derive the following two equations:

$$V_{cp} \cong V_{r1} = I_{ptat1} R_1 \qquad (3)$$

$$V_{cn} \cong V_{r2} = V_{DD} - I_{ptat2} R_2 \qquad (4)$$

It is clear that $V_{cp}$ rises (falls) when the temperature rises (falls), whereas $V_{cn}$ falls (rises) when the temperature rises (falls). Therefore, $V_{cp}$ has a positive temperature coefficient, whereas $V_{cn}$ has a negative temperature coefficient.

The principle of this present disclosure can apply to other VCO circuit embodiments. For instance, the regenerative network 220 can be embodied using two cross-coupling PMOS transistors or using a combination of two cross-coupling NMOS transistors and two cross-coupling PMOS transistors, instead of using two cross-coupling NMOS transistors as shown in the case of VCO 200 of FIG. 2.

The two varactors 231 and 232 are backward connected, therefore an increase of $V_c$ will lead to a decrease of $C_{230}$ and thus an increase of $f_{osc}$. This is just by way of example but not limitation. In an alternative embodiment not explicitly shown in FIG. 2, varactors 231 and 232 are forward connected, i.e., the "+" terminal of varactor 231 connects to $V_c$, the "−" terminal of varactor 231 connects to node 201, the "+" terminal of varactor 232 connects to $V_c$, and the "−" terminal of varactor 232 connects to node 202. In this alternative embodiment, an increase of $V_c$ will lead to an increase of $C_{230}$ and thus a decrease of $f_{osc}$. This is workable, provided the control voltage is adapted in a correct direction in a closed-loop control manner.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A VCO (voltage-controlled oscillator) comprising:
a resonant tank comprising a parallel connection of an inductor, a fixed capacitor, a variable capacitor, a first temperature compensating capacitor, and a second temperature compensating capacitor across a first node and a second node, and configured to establish an oscillation of a first oscillatory voltage at the first node and a second oscillatory voltage at the second node, wherein each of the inductor, the fixed capacitor, the variable capacitor, the first temperature compensating capacitor and the second temperature compensating capacitor has an end connected to the first node and an opposite end connected to the second node;
a regenerative network placed across the first node and the second node to provide energy to sustain the oscillation, wherein the variable capacitor is controlled by a control voltage, the first temperature compensating capacitor is controlled by a first temperature tracking voltage of a positive temperature coefficient, and the second temperature compensating capacitor is controlled by a second temperature tracking voltage of a negative temperature coefficient; and
a temperature tracking voltage generator configured to output the first temperature tracking voltage and the second temperature tracking voltage based on a first current and a second current that are both proportional to an absolute temperature.

2. The VCO of claim 1, wherein the first temperature compensating capacitor comprises series connection of a first backward connected varactor connected at one terminal to the first node and controlled by the first temperature tracking voltage and a second backward connected varactor connected at one terminal to the second node and controlled by the first temperature tracking voltage, wherein the first temperature tracking voltage is applied at a series connection node of a connection point between the first backward connected varactor and the second backward connected varactor.

3. The VCO of claim 2, wherein the second temperature compensating capacitor comprises a series connection a first forward connected varactor connected at one terminal to the first node and controlled by the second temperature tracking voltage and a second forward connected varactor connected to the second node and controlled by the second temperature tracking voltage.

4. The VCO of claim 1, wherein the variable capacitor comprises a first varactor connected to the first node and controlled by the control voltage and a second varactor connected to the second node and control by the control voltage.

5. The VCO of claim 4, wherein the first varactor and the second varactor are backward connected.

6. The VCO of claim 4, wherein the first varactor and the second varactor are forward connected.

7. A VCO (voltage-controlled oscillator) comprising:
a resonant tank comprising a parallel connection of an inductor, a fixed capacitor, a variable capacitor, a first temperature compensating capacitor, and a second temperature compensating capacitor across a first node and a second node, and configured to establish an oscillation of a first oscillatory voltage at the first node and a second oscillatory voltage at the second node;
a regenerative network placed across the first node and the second node to provide energy to sustain the oscillation, wherein the variable capacitor is controlled by a control voltage, the first temperature compensating capacitor is controlled by a first temperature tracking voltage of a positive temperature coefficient, and the second temperature compensating capacitor is controlled by a second temperature tracking voltage of a negative temperature coefficient; and
a temperature tracking voltage generator configured to output the first temperature tracking voltage and the second temperature tracking voltage based on a first current and a second current that are both proportional to an absolute temperature.

8. The VCO of claim 7, wherein the temperature tracking voltage generator comprises: a ground-terminated resistor configured to receive the first current and output a first reference voltage; and a supply-terminated resistor configured to receive the second current and output a second reference voltage.

9. The VCO of claim 8, wherein the temperature tracking voltage generator further comprises: a first low-pass filter configured to receive the first reference voltage and output the first temperature tracking voltage; and a second low-pass filter configured to receive the second reference voltage and output the second temperature tracking voltage.

10. The VCO of claim 9, wherein each of the first low-pass filter and the second low-pass filter comprises a series resistor and a shunt capacitor.

* * * * *